(12) United States Patent
Swanson et al.

(10) Patent No.: US 8,472,279 B2
(45) Date of Patent: Jun. 25, 2013

(54) CHANNEL SKEWING

(75) Inventors: Travis E. Swanson, Ramsey, MN (US);
Paul J. Voit, Ham Lake, MN (US); Ryan M. Przybilla, Saint Anthony, MN (US)

(73) Assignee: Micron Technology, Inc., Boise, ID (US)

( * ) Notice: Subject to any disclaimer, the term of this patent is extended or adjusted under 35 U.S.C. 154(b) by 352 days.

(21) Appl. No.: 12/872,913

(22) Filed: Aug. 31, 2010

(65) Prior Publication Data

US 2012/0051171 A1  Mar. 1, 2012

(51) Int. Cl.
*G11C 8/00* (2006.01)

(52) U.S. Cl.
USPC .................. 365/233.1; 365/194; 326/38

(58) Field of Classification Search
USPC ........... 365/233, 194, 189.12, 201, 189.05, 365/193, 226, 189.08, 230.08, 154, 230.06, 365/185.21, 205, 207, 49, 168, 149, 129
See application file for complete search history.

(56) References Cited

U.S. PATENT DOCUMENTS

| | | | |
|---|---|---|---|
| 6,356,100 B1 | 3/2002 | Wallace, Jr. et al. | |
| 6,795,954 B2 | 9/2004 | Andreev et al. | |
| 6,946,870 B1 * | 9/2005 | Lesea | 326/38 |
| 7,486,702 B1 | 2/2009 | Yang | |
| 7,746,698 B2 | 6/2010 | Liu et al. | |
| 2005/0259504 A1 | 11/2005 | Murtugh et al. | |
| 2007/0195632 A1 | 8/2007 | Kim et al. | |
| 2008/0049520 A1 * | 2/2008 | Kang et al. | 365/185.33 |
| 2009/0174455 A1 | 7/2009 | Dimitriu et al. | |
| 2010/0002527 A1 * | 1/2010 | Kurjanowicz | 365/189.05 |
| 2010/0146229 A1 | 6/2010 | Yang et al. | |
| 2010/0188910 A1 * | 7/2010 | Kizer et al. | 365/193 |

OTHER PUBLICATIONS

International Search Report and Written Opinion for related PCT Application No. PCT/US2011/001486 mailed Feb. 9, 2012 (9 pp.).

* cited by examiner

*Primary Examiner* — Dang Nguyen

(74) *Attorney, Agent, or Firm* — Brooks, Cameron & Huebsch, PLLC

(57) ABSTRACT

Methods and systems for channel skewing are described. One or more methods for channel skewing includes providing a number of groups of data signals to a memory component, each of the number of groups corresponding to a respective channel, and adjusting a phase of a group of data signals corresponding to at least one of the number of channels such that the group of data signals are skewed with respect to a group of data signals corresponding to at least one of the other respective channels.

32 Claims, 5 Drawing Sheets

| # SKEW GROUPS(S) | CHANNELS | SKEW $\left(d = \dfrac{T_{clk}}{S}\right)$ |
|---|---|---|
| 2 | 1-16 | 0d |
| | 17-32 | d |
| 2 | ODD | 0d |
| | EVEN | d |
| 2 | 1-8, 17-24 | 0d |
| | 9-16, 25-32 | d |

*Fig. 4*

| # SKEW GROUPS(S) | CHANNELS | SKEW $\left(d = \dfrac{T_{clk}}{S}\right)$ |
|---|---|---|
| 4 | 1-8 | 0d |
| | 9-16 | d |
| | 17-24 | 2d |
| | 25-32 | 3d |
| 4 | 1-4, 17-20 | 0d |
| | 5-8, 21-24 | d |
| | 9-12, 25-28 | 2d |
| | 13-16, 29-32 | 3d |
| 4 | 1, 5, 9, 13, 17, 21, 25, 29 | 0d |
| | 2, 6, 10, 14, 18, 22, 26, 30 | d |
| | 3, 7, 11, 15, 19, 23, 27, 31 | 2d |
| | 4, 8, 12, 16, 20, 24, 28, 32 | 3d |

*Fig. 5*

32 SKEW GROUPS $\left(d = \dfrac{T_{clk}}{S}\right)$ ← 630

| CHANNEL 634 | SKEW A 640-1 | SKEW B 640-2 | SKEW C 640-3 |
| --- | --- | --- | --- |
| 1 | 0d | 0d | 0d |
| 2 | 4d | 8d | 16d |
| 3 | 8d | 16d | 1d |
| 4 | 12d | 24d | 17d |
| 5 | 16d | 1d | 2d |
| 6 | 20d | 9d | 18d |
| 7 | 24d | 17d | 3d |
| 8 | 28d | 25d | 19d |
| 9 | 1d | 2d | 4d |
| 10 | 5d | 10d | 20d |
| 11 | 9d | 18d | 5d |
| 12 | 13d | 26d | 21d |
| 13 | 17d | 3d | 6d |
| 14 | 21d | 11d | 22d |
| 15 | 25d | 19d | 7d |
| 16 | 29d | 27d | 23d |
| 17 | 2d | 4d | 8d |
| 18 | 6d | 12d | 24d |
| 19 | 10d | 20d | 9d |
| 20 | 14d | 28d | 25d |
| 21 | 18d | 5d | 10d |
| 22 | 22d | 13d | 26d |
| 23 | 26d | 21d | 11d |
| 24 | 30d | 29d | 27d |
| 25 | 3d | 6d | 12d |
| 26 | 7d | 14d | 28d |
| 27 | 11d | 22d | 13d |
| 28 | 15d | 30d | 29d |
| 29 | 19d | 7d | 14d |
| 30 | 23d | 15d | 30d |
| 31 | 27d | 23d | 15d |
| 32 | 31d | 31d | 31d |

*Fig. 6*

CHANNEL SKEWING

TECHNICAL FIELD

The present disclosure relates generally to semiconductor memory devices, methods, and systems, and more particularly, to methods, devices, and systems for channel skewing.

BACKGROUND

Memory devices are typically provided as internal, semiconductor, integrated circuits in computers or other electronic devices. There are many different types of memory including volatile and non-volatile memory. Volatile memory can require power to maintain its information and includes random-access memory (RAM), dynamic random access memory (DRAM), and synchronous dynamic random access memory (SDRAM), among others. Non-volatile memory can provide persistent information by retaining stored information when not powered and can include NAND flash memory, NOR flash memory, read only memory (ROM), Electrically Erasable Programmable ROM (EEPROM), Erasable Programmable ROM (EPROM), phase change random access memory (PCRAM), resistive random access memory (RRAM), and magnetic random access memory (MRAM), such as spin torque transfer random access memory (STT RAM), among others.

Memory devices can be combined together to form a solid state drive (SSD). A solid state drive can include non-volatile memory (e.g., NAND flash memory and NOR flash memory), and/or can include volatile memory (e.g., DRAM and SRAM), among various other types of non-volatile and volatile memory. An SSD can be used to replace hard disk drives as the main storage device for a computer, as the solid state drive can have advantages over hard drives in terms of performance, size, weight, ruggedness, operating temperature range, and power consumption. For example, SSDs can have superior performance when compared to magnetic disk drives due to their lack of moving parts, which may avoid seek time, latency, and other electro-mechanical delays associated with magnetic disk drives. SSD manufacturers can use non-volatile flash memory to create flash SSDs that may not use an internal battery supply, thus allowing the drive to be more versatile and compact.

An SSD can include a number of memory devices (e.g., a number of memory chips). As used herein, "a number of" something can refer to one or more of such things (e.g., a number of memory devices can refer to one or more memory devices). As one of ordinary skill in the art will appreciate, a memory chip can include a number of dies and/or logical units (LUNs). Each die can include a number of memory arrays and peripheral circuitry thereon. The memory arrays can include a number of memory cells organized into a number of physical pages, and the physical pages can be organized into a number of blocks.

In many electronic devices and systems, electronic data is communicated between electronic components. In certain applications, multi-element electronic data is transmitted from one component to another. Such a data transmission may involve transmitting a plurality of signals simultaneously from a transmitting component to a receiving component via parallel channels. The signals may be processed at the receiving component to be compatible with a particular protocol.

When a plurality of signals are transmitted between two components, crosstalk and/or simultaneous switching output (SSO) noise can occur. Crosstalk can occur when energy on one channel induces voltages and/or currents on a neighboring channel through capacitive and/or inductive coupling. SSO noise can affect the power distribution associated with a chip as data signals between and/or among multiple channels switch (e.g., from low to high or low to high) simultaneously. Crosstalk and/or SSO noise can increase the voltage noise and peak power associated with a memory system. As the frequency of data transmission rates increases, crosstalk and SSO noise may further adversely affect the quality of signals, resulting in errors.

BRIEF DESCRIPTION OF THE DRAWINGS

FIG. 4 is a table illustrating skew amounts for a number of channels associated with a number of skew groups according to one or more embodiments of the present disclosure.

FIG. 5 is a table illustrating skew amounts for a number of channels associated with a number of skew groups according to one or more embodiments of the present disclosure.

FIG. 6 is a table illustrating skew amounts for a number of channels associated with a number of skew groups according to one or more embodiments of the present disclosure.

DETAILED DESCRIPTION

Figure 1:
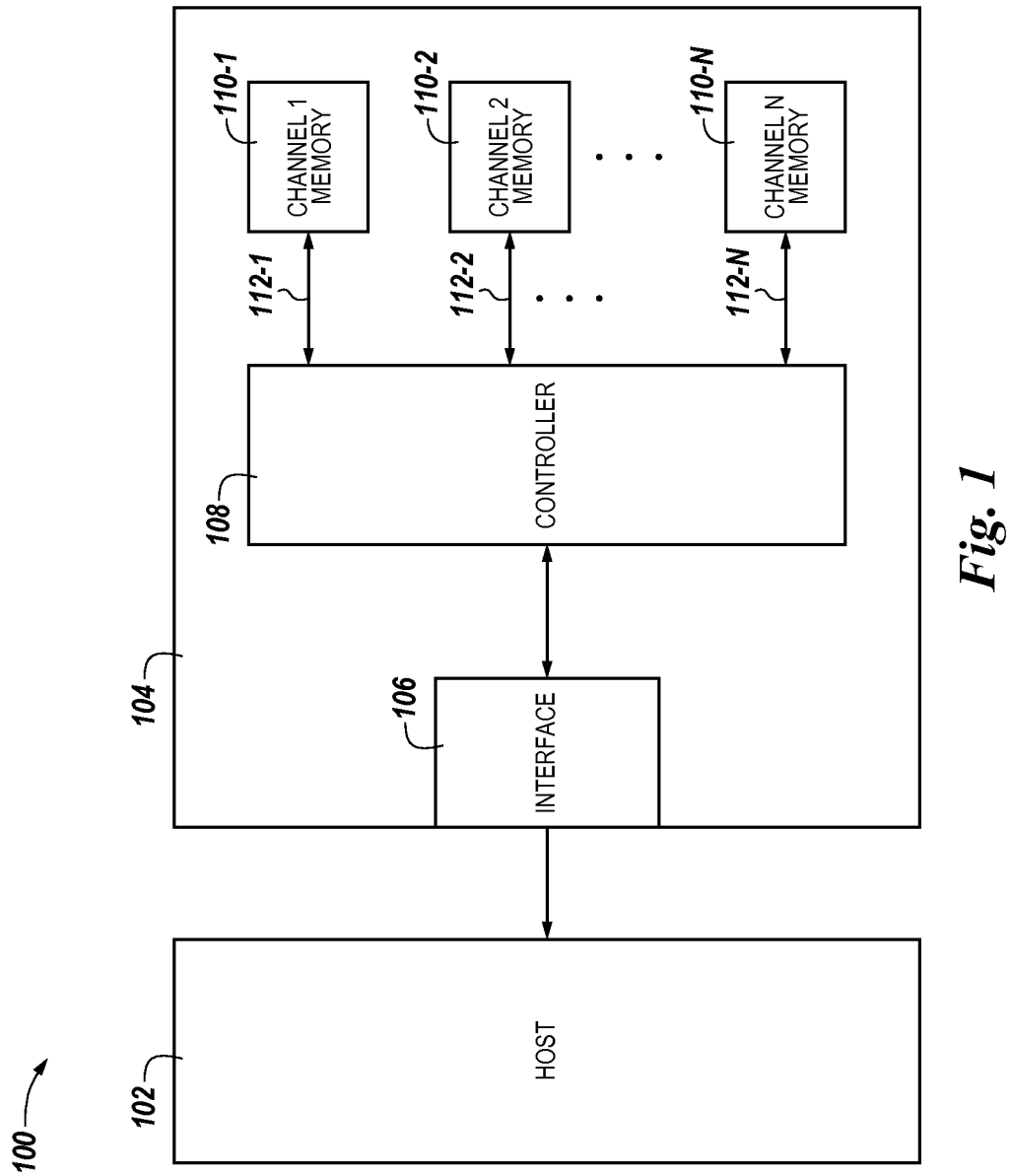
FIG. 1 is a block diagram of a computing system including at least one memory system in accordance with one or more embodiments of the present disclosure.

The present disclosure includes methods and systems for channel skewing. One method embodiment includes providing a number of groups of data signals to a memory component, each of the number of groups corresponding to a respective channel, and adjusting a phase of a group of data signals corresponding to at least one of the number of channels such that the group of data signals are skewed with respect to a group of data signals corresponding to at least one of the other respective channels.

Embodiments of the present disclosure can provide various benefits such as reducing the effects of simultaneous switching output (SSO) noise and/or crosstalk associated with electronic systems having multiple channels. As an example, embodiments can reduce the voltage noise and/or peak power caused by SSO noise. One or more embodiments can reduce the effects of SSO noise without extensive modifications to receiving circuitry as compared to previous approaches.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "N," and "M," particularly with respect to reference numerals in the drawings, indicates that a number of the particular feature so designated can be included with one or more embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 108 may reference element "08" in FIG. 1, and a similar element may be referenced as 208 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present invention, and should not be taken in a limiting sense.

FIG. 1 is a block diagram of a computing system 100 including at least one memory system 104 in accordance with one or more embodiments of the present disclosure. As one example, the memory system 104 can be a solid state drive (SSD). The memory system 104 can include a host interface 106, a memory controller 108 (e.g., memory control circuitry and/or firmware), and one or more memory devices 110-1 (CHANNEL 1 MEMORY), 110-2 (CHANNEL 2 MEMORY), ..., 110-N (CHANNEL N MEMORY) coupled to the controller 108 via respective channels 112-1, 112-2, ..., 112-N. Embodiments are not limited to a particular number of channels 112-1, 112-2, ... 112-N. For instance, the number of channels of system 100 can be 4, 8, 16, 32, etc. in one or more embodiments, the number of channels may not be the same as the number of memory devices. For example, one or more of the channels 112-1, 112-2, ..., 112-N can correspond to more or less than one memory device 110-1, 110-2, ..., 110-N.

The memory devices 110-1, 110-2, ..., 110-N provide a storage volume for the memory system 104 and can be, for example, solid state memory devices including non-volatile multilevel memory cells. The memory devices 110-1, 110-2, ..., 110-N can include one or more arrays of memory cells and receiving circuitry (not shown) configured to receive and process signals (e.g., data signals) from the controller 108 and can transfer those signals to other internal circuitry (not shown) of the memory devices 110-1, 110-2, ..., 110-N. As one example, the arrays of memory cells can be flash arrays having a NAND architecture.

The host interface 106 can be used to communicate information between the memory system 104 and another device such as a host system 102. Host system 102 can include a memory access device, such as a processor, for example. One of ordinary skill in the art will appreciate that "a processor" can intend one or more processors, such as a parallel processing system, a number of coprocessors, etc. Examples of host systems 102 include laptop computers, personal computers, digital cameras, digital recording and playback devices, mobile telephones, PDAs, memory card readers, interface hubs, and the like. For one or more embodiments, the host interface 106 can be in the form of a standardized interface. For example, when the memory system 104 is used for information storage in a computing system 100, the physical host interface 106 can be a serial advanced technology attachment (SATA), peripheral component interconnect express (PCIe), or a universal serial bus (USB), among other connectors and interfaces. In general, however, host interface 106 can provide an interface for passing control, address, data, and other signals between the memory system 104 and a host system 102 having compatible receptors for the host interface 106.

In one or more embodiments, the memory controller 108 can be an application specific integrated circuit (ASIC) coupled to a printed circuit board including the physical host interface 106 and memory devices 110-1, 110-2, ..., 110-N. As illustrated in FIG. 1, the memory controller 108 can be coupled to the host interface 106 and to the memory devices 110-1, 110-2, ..., 110-N by the plurality of channels 112-1, 112-2, ..., 112-N. The memory controller 108 can be configured to perform the operations described herein, in addition to other memory operations as will be appreciated by those skilled in the art.

The memory controller 108 can communicate with the memory devices 110-1, 110-2, ..., 110-N via the plurality of channels 112-1, 112-2, ..., 112-N to read, write, and erase data, among other operations. Although the memory devices 110-1, 110-2, ..., 110-N are illustrated being coupled to a collective memory controller 108, one or more embodiments of the present disclosure can include a discrete memory controller for each memory channel 112-1, 112-2, ..., 112-N. The channels 112-1, 112-2, ..., 112-N can each include one or more buses (e.g., an address bus and/or data bus) having various types of bus structures including, but not limited to, bus structures related to Open NAND Flash Interface (ONFI), Compact Flash Interface, Multimedia Card (MMC), Secure Digital (SD), CE-ATA, Industrial Standard Architecture (ISA), Micro-Channel Architecture (MSA), Extended ISA (EISA), Intelligent Drive Electronics (IDE), VESA. Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

As described further herein, groups of data signals can be provided, along with a channel clock signal, to the memory devices 110-1, 110-2, ..., 110-N via the respective channels 112-1, 112-2, ..., 112-N. In one or more embodiments, each channel can have a dedicated channel clock signal configured to transmit a corresponding group of data signals in a source-synchronous manner (e.g., the channel clock is sourced along with the corresponding group of data signals).

One or more embodiments include skewing one or more of the respective channels 112-1, 112-2, ..., 112-N with respect to each other. As used herein, "skewing" a channel implies adjusting a phase of (e.g., by providing a delay or a phase shift to) the data signals, address signals, control signals, channel clock signals, and/or other signals corresponding to one or more particular channel 112-1, 112-2, ..., 112-N. Examples described herein that refer to skewing data signals and/or channel clock signals of one or more channels can also include skewing control signals, address signals, and other signals corresponding to particular channels in a similar manner. In various embodiments, the channels 112-1, 112-2, ..., 112-N are skewed such that the data signals of at least one channel are skewed with respect to the data signals of at least one other channel. In one or more embodiments, the respective data signals of a particular channel are unskewed with respect to each other. As an example, a group of data signals of a first channel may be in phase with each other while a group of data signals of a different channel (e.g., an adjacent channel) that are in phase with each other are out of phase with the group of data signals of the first channel. As such, the data signals of the first channel will not switch (e.g., transition from low to high or high to low) simultaneously with the data signals of the different channel, which can reduce the SSO noise of the system 104, among other benefits. As described further below, in various embodiments, each of the channels 112-1, 112-2, ..., 112-N can be provided with a different skew amount; however, embodiments are not so limited. For instance, in one or more embodiments, half of the channels 112-1, 112-2, ..., 112-N may have a first skew amount and the other half of the channels may have a different skew amount.

Figure 2:
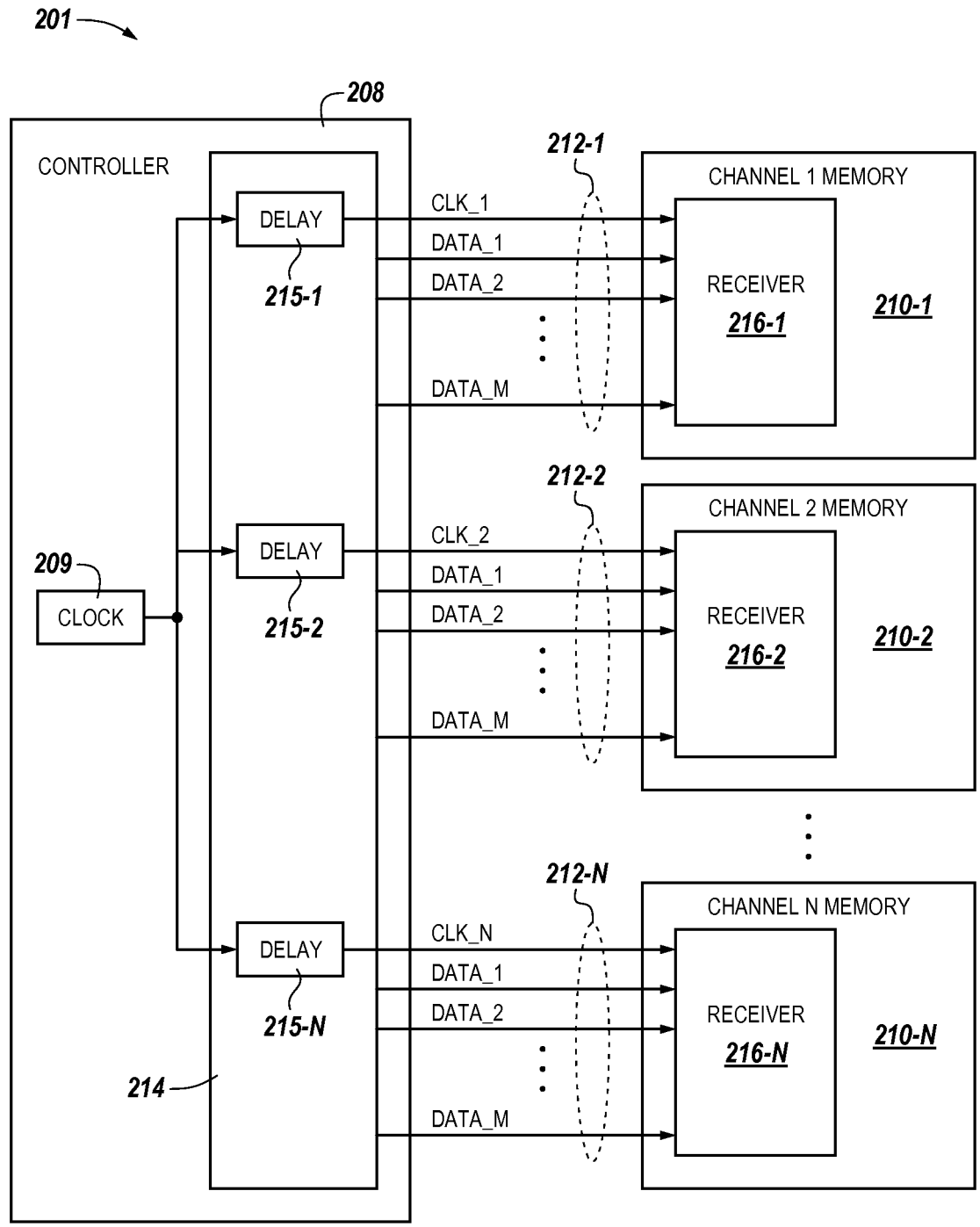
FIG. 2 illustrates a block diagram of a portion of a memory system in accordance with one or more embodiments of the present disclosure.

FIG. 2 illustrates a block diagram of a portion 201 of a memory system in accordance with one or more embodiments of the present disclosure. As an example, the portion 201 can be a portion of a memory system such as memory system 104 described in connection with FIG. 1. The example shown in FIG. 2 includes a controller 208 configured to provide a number of signals to a plurality of memory devices 210-1, 210-2, ..., 210-N via a respective plurality of channels 212-1, 212-2, ..., 212-N.

In this example, each of the channels 212-1, 212-2, ..., 212-N include a group of data signals (DATA_1, DATA_2, ..., DATA_M) and a respective associated channel clock signal (CLK_1, CLK_2, ..., CLK_M). The data signals and corresponding channel clock signals are provided from a transmit component 214 of controller 208 to a receiver component 216-1, 216-2, ..., 216-N of a respective memory device 210-1, 210-2, ..., 210-N. As described above, the channel clock signals can be dedicated channel clock signals used in association with transmission of the corresponding data signals in a source-synchronous manner. The memory devices 210-1, 210-2, ..., 210-N can be physically located on the same die, in one or more embodiments, and can include one or more memory arrays.

In the example illustrated in FIG. 2, the transmit component 214 includes a number of delay components 215-1, 215-2, ..., 215-N corresponding to each of the respective channels 212-1, 212-2, ..., 212-N. The delay components 215-1, 215-2, ..., 215-N each receive a reference clock signal from clock 209. The reference clock 209 can be a system clock associated with controller 208, for example. As described further in connection with FIG. 3, the delay components 215-1, 215-2, ..., 215-N can be configured to provide an adjustable delay to the reference clock signal such that one or more of the channel clock signals (e.g., CLK_1, CLK_2, ..., CLK_N) are skewed with respect to each other. Accordingly, one or more of the groups of data signals (e.g., DATA_1, DATA_2, ..., DATA_M) of the channels 212-1, 212-2, ..., 212-N can be skewed with respect to each other.

As described further in connection with FIGS. 4-6, in one or more embodiments, the channels 212-1, 212-2, ..., 212-N can be skewed in accordance with a number of skew groups, with the channels in each of the number skew groups having the same skew amount (e.g., the groups of data signals of the channels in each skew group are skewed evenly such that they are in phase with each other). In such embodiments, each skew group has a different skew amount than every other skew group in one or more embodiments, the number of skew groups is at least two and each skew group includes at least one channel (e.g., 212-1, 212-2, ..., 212-N). In one or more embodiments, the number of skew groups is at least two and each skew group includes at least two channels (e.g., 212-1, 212-2, ..., 212-N).

The amount of skew associated with each skew group can be based, at least partially, on a period of the reference clock 209. For instance, in one or more embodiments, the amount of skew associated with any particular skew group is less than a period of the reference dock signal of clock 209, which can prevent clock crossing issues within the system 201.

In one or more embodiments, the number of skew groups can be the same as the number of channels (e.g., each channel can have a different skew amount than every other channel). In such embodiments, the amount of skew associated with each of the channels can vary. For instance, the delay components 215-1, 215-2, ..., 215-N can be configured such that each of the channels is skewed by one half of the reference clock period with respect to adjacent channels. In one or more embodiments, the delay components 215-1, 215-2, ..., 215-N can be configured such that each adjacent channel is skewed by an amount equal to at least one quarter of the period of the reference clock signal. In some such embodiments, the delay components 215-1, 215-2, ..., 215-N can be configured to adjust the phases of each of the channel clock signals (e.g., CLK_1, CLK_2, ..., CLK_N) such that the data signals (e.g., DATA_1, DATA_2, ..., DATA_M) corresponding to each of the respective channels 212-1, 212-2, ..., 212-N have an adjusted phase that is a multiple of the period of the controller clock signal divided by the total number of channels (e.g., N).

As noted above, in one or more embodiments, the respective data signals of each of the channels 212-1, 212-2, ..., 212-N are maintained in an unskewed state with respect to each other. As such, the receiver components 216-1, 216-2, ..., 216-N do not de-skew the respective data signals (e.g., DATA_1, DATA_2, ..., DATA_M) of each channel 212-1, 212-2, ..., 212-N. Maintaining the respective data signals of the channels 212-1, 212-2, ..., 212-N in an unskewed state can provide benefits such as requiring little or no modifications to devices (e.g., memory devices 210-1, 210-2, ..., 210-N) coupled to the controller 208 via the channels 212-1, 212-2, ..., 212-N (e.g., the receiver components 216-1, 216-2, ..., 216-N can be traditional receiver components).

Figure 3:
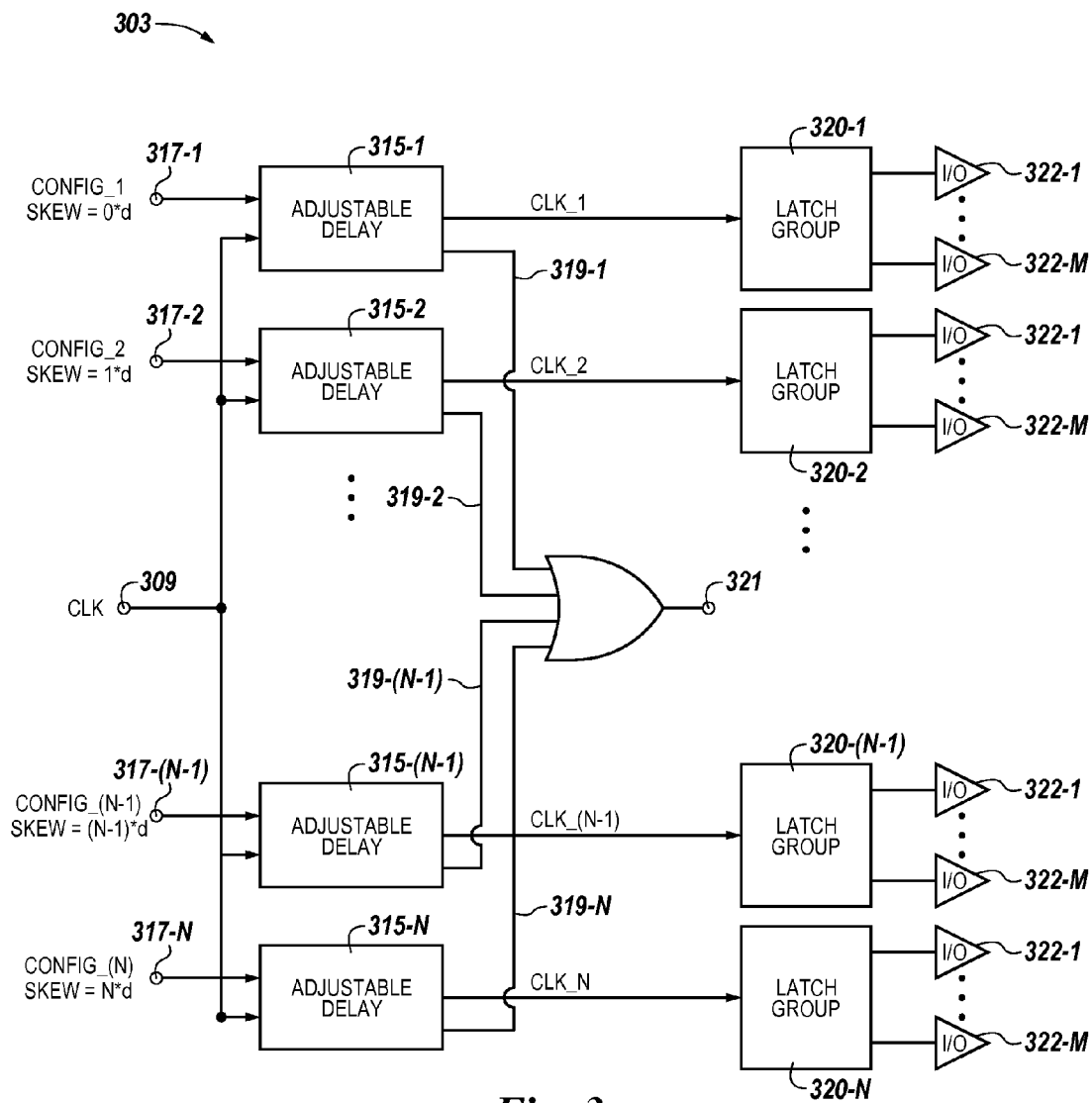
FIG. 3 illustrates a functional block diagram of a portion of a memory system in accordance with one or more embodiments of the present disclosure.

FIG. 3 illustrates a functional block diagram of a portion 303 of a memory system in accordance with one or more embodiments of the present disclosure. As an example, the portion 303 can be a portion of a memory system such as memory system 104 described in connection with FIG. 1. The example shown in FIG. 3 includes a number of delay components 315-1, 315-2, ..., 315-(N−1), 315-N. The delay components 315-1, 315-2, ..., 315-(N−1), 315-N can be delay components such as delay components 215-1, 215-2, ..., 215-N described in connection with FIG. 2.

Each of the delay components 315-1, 315-2, ..., 315-(N−1), 315-N receives a reference clock signal 309 and a respective configuration signal 317-1 (CONFIG_1), 317-2 (CONFIG_2), ..., 317-(N−1) (CONFIG_(N−1)), 317-N (CONFIG_N). In the example illustrated in FIG. 3, each of the delay components 315-1, 315-2, ..., 315-(N−1), 315-N outputs a respective channel clock signal (e.g., CLK_1, CLK_2, ..., CLK_(N−1), CLK_N) and a respective skew boundary signal 319-1, 319-2, ..., 319-(N−1), 319-N. The delay components 315-1, 315-2, ..., 315-(N−1), 315-N are configured to skew the channel clock signals with respect to each other. That is, the delay components are configured to shift the phases of the channel clock signals (e.g., CLK_1, CLK_2, ..., CLK_(N−1), CLK_N) with respect to each other such that the groups of data signals (e.g., DATA_1, DATA_2, ..., DATA_M shown in FIG. 2) corresponding to the respective channels switch at different times, which reduces the SSO noise associated with the system.

In the example shown in FIG. 3, the delay components are adjustable (e.g., programmable) delay components 315-1, 315-2, ..., 315-(N−1), 315-N. As such, the particular amount of delay of the respective delay components 315-1, 315-2, ..., 315-(N−1), 315-N can be changed. The configuration signals 317-1, 317-2, ..., 317-(N−1), 317-N determine the particular amount of skew provided by the respective delay components 315-1, 315-2, ..., 315-(N−1), 315-N. In this example, each of the delay components are skewed by a different amount with respect to each other. For instance, as shown in FIG. 3, delay component 315-1 is configured to provide a delay amount of 0*d (SKEW=0*d) responsive to configuration signal 317-1. In one or more embodiments, a delay amount of 0*d (e.g., no skew) can imply that the corresponding channel clock signal is in phase with the reference clock signal. Delay component 315-2 is configured to provide a delay amount of 1*d (SKEW=1*d) responsive to configuration signal 317-2. Delay component 315-(N−1) is configured to provide a delay amount of (N−1)*d (SKEW=(N−1)*d) responsive to configuration signal 317-(N−1). Delay component 315-N is configured to provide a delay amount of N*d (SKEW=N*d) responsive to configuration signal 317-N. In this example, "d" is equal to the period of the reference clock 309 (Tclk) divided by the number of channels (e.g., d=Tclk/N). In one or more embodiments, and as illustrated in FIG. 3, the system 303 includes a phase detect component that receives the skew boundary signals 319-1, 319-2, ..., 319-(N−1), 319-N from the delay components 315-1, 315-2, ..., 315-(N−1), 315-N. The output signal 321 of the phase detect component can be used to detect when the skew amount reaches an uppermost value. For instance, the output signal 321 can indicate that the skew amount reaches a value equal to the period of the reference clock 309. Preventing the skew amount from exceeding a value equal to the period of the reference clock can prevent clock crossing issues in the circuitry, among other benefits.

As described herein, in one or more embodiments, one or more of the channel clock signals CLK_1, CLK_2, CLK_(N−1), CLK_N can be skewed by the same amount. For instance, the channels can be organized into skew groups, with the respective channels in each skew group having the same skew amount (e.g., the respective channel clock signals are in phase with each other). Examples of skew groups are described further below in connection with FIGS. 4-6.

FIG. 3 includes a number of latch groups 320-1, 320-2, ..., 320-(N−1), 320-N. The latch groups 320-1, 320-2, ..., 320-(N−1), 320-N latch the groups of data signals corresponding to the respective channel clock signals CLK_1, CLK_2, ..., CLK_(N−1), CLK_N and provide the signals as data input/output (I/O) signals 322-1, ..., 322-M to other components of the system.

FIGS. 4-6 include tables illustrating skew amounts for a number of channels associated with a number of skew groups in accordance with one or more embodiments of the present disclosure. The skew amounts described in FIGS. 4-6 can be provided by one or more of the systems described herein. The examples shown in FIGS. 4-6 assume a computing system having 32 channels; however, embodiments are not limited to systems having a particular number of channels associated therewith. The channels are numbered 1-32 and the numbering represents the positioning of the channels with respect to each other. For instance, channel 1 is adjacent to channel 2, channel 3 is adjacent to channels 2 and 4, etc.

In table 430 of FIG. 4, column 432 indicates the number of skew groups (S). In this example, the channels are divided into two (2) skew groups (e.g., 16 channels in each skew group). Column 434 indicates the particular channels within each of the two skew groups. Column 436 indicates the skew amount (SKEW) corresponding to each of the two skew groups. In this example, each of the skew groups has a skew amount equal to a multiple of d, where d=Tclk/S. Tclk is the period of the reference clock signal (e.g., 209 shown in FIG. 2 or 309 shown in FIG. 3) corresponding to the computing system. Accordingly, in the example shown in FIG. 4, each skew group is skewed by an amount equal to a multiple of Tclk/2.

In the embodiment shown in FIG. 4, rows 440-1, 440-2, and 440-3 illustrate different respective groupings for the 32 channels. For example, row 440-1 illustrates channels 1-16 having a skew amount of 0 d (e.g., channels 1-16 are not delayed with respect to the reference clock), while channels 17-32 have a skew amount of d (e.g., channels 17-32 are skewed by an amount equal to Tclk/2 with respect to channels 1-16). Row 440-2 illustrates the odd numbered channels having a skew amount of 0 d and the even numbered channels having a skew amount of d. Accordingly, all adjacent channels are skewed by Tclk/2 with respect to each other. Row 440-3 illustrates channels 1-8 and 17-24 having a skew amount of 0 d, while channels 9-16 and 25-32 are skewed by an amount d.

In table 530 of FIG. 5, column 532 indicates the number of skew groups (S). In this example, the channels are divided into four (4) skew groups (e.g., 8 channels in each skew group). Column 534 indicates the particular channels within each of the four skew groups. Column 536 indicates the skew amount (SKEW) corresponding to each of the four skew groups. In this example, each of the skew groups has a skew amount equal to a multiple of d, where d=Tclk/S. Accordingly, in the example shown in FIG. 5, each skew group is skewed by an amount equal to a multiple of Tclk/4. For instance, each of rows 540-1, 540-2, and 540-3 illustrate a first skew group having a skew amount of 0 d (e.g., no skew), a second skew group having a skew amount of d (e.g., Tclk/4), a third skew group having a skew amount of 2 d (e.g., Tclk/2), and a fourth skew group having a skew amount of 3 d (e.g., 3*Tclk/4). Column 534 illustrates the particular channels corresponding to the different groupings illustrated by rows 540-1, 540-2, and 540-3. In various embodiments, the channels can be grouped in a manner so as to maximize the amount of skew between adjacent channels.

Row 540-1 illustrates channels 1-8 having a skew amount of 0 d, channels 9-16 having a skew amount of d, channels 17-24 having a skew amount of 2 d, and channels 25-32 having a skew amount of 3 d. Row 540-2 illustrates channels 1-4 and 17-20 having a skew amount of 0 d, channels 5-8 and 21-24 having a skew amount of d, channels 9-12 and 25-28 having a skew amount of 2 d, and channels 13-16 and 29-32 having a skew amount of 3 d.

Row 540-3 illustrates channels 1, 5, 9, 13, 17, 21, 25, and 29 (e.g., group 1) having a skew amount of 0 d, channels 2, 6, 10, 14, 18, 22, 26, and 30 (e.g., group 2) having a skew amount of d, channels 3, 7, 11, 15, 19, 23, 27, and 31 (e.g., group 3) having a skew amount of 2 d, and channels 4, 8, 12, 16, 20, 24, 28, and 32 (e.g., group 4) having a skew amount of 3 d. As such, no adjacent channel has the same skew amount associated therewith.

In table 630 of FIG. 6, each channel has a different skew amount such that there are 32 skew groups (S) (e.g., each channel is its own skew group). In this example, each of the skew groups has a skew amount equal to a multiple of d, where d=Tclk/S. Accordingly, in the example shown in FIG. 6, each skew group (e.g., each channel) is skewed by an amount equal to a multiple of Tclk/32. In the example illustrated in FIG. 6, columns 640-1 (SKEW A), 640-2 (SKEW B), and 640-3 (SKEW C) illustrate three respective different manners of skewing the particular channels.

In the example illustrated in column 640-1, each adjacent channel is skewed by an amount equal to Tclk/8 with respect each other. In the example illustrated in column 640-2, each adjacent channel is skewed by an amount equal to Tclk/4 with respect each other. In the example illustrated in column 640-3, each adjacent channel is skewed by an amount equal to Tclk/2 with respect each other.

Skewing channels in accordance with embodiments described herein can reduce the effects of simultaneous switching output (SSO) noise and/or crosstalk associated with electronic systems having multiple channels, among other benefits. For instance, one or more embodiments can reduce the effects of SSO noise without extensive modifications to receiving circuitry as compared to previous approaches. One or more embodiments can be implemented such that they are independent of one or more particular devices coupled to a channel.

CONCLUSION

The present disclosure includes methods and systems for channel skewing. One method embodiment includes providing a number of groups of data signals to a memory component, each of the number of groups corresponding to a respective channel, and adjusting a phase of a group of data signals corresponding to at least one of the number of channels such that the group of data signals are skewed with respect to a group of data signals corresponding to at least one of the other respective channels.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. As used herein, the term "and/or" includes any and all combinations of one or more of the associated listed items.

As used herein, the term "and/or" includes any and all combinations of one or more of the associated listed items. As used herein the term "or," unless otherwise noted, means logically inclusive or. That is, "A or B" can include (only A), (only B), or (both A and B). In other words, "A or B" can mean "A and/or B" or "one or more of A and B."

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for channel skewing, comprising:
providing a number of groups of data signals to a memory component comprising a plurality of memory devices, each of the number of groups corresponding to a respective channel, and each of the number of groups of data signals having a different channel clock signal associated therewith;
adjusting a phase of a group of data signals corresponding to at least one of the number of channels such that the group of data signals are skewed with respect to a group of data signals corresponding to at least one of the other respective channels; and
providing the respective different channel clock signals to the plurality of memory devices along with the respective groups of data signals.

2. The method of claim 1, wherein the respective data signals of the group of data signals corresponding to each of the at least one of the number of channels are unskewed with respect to each other.

3. The method of claim 1, wherein adjusting the phase of the group of data signals corresponding to the at least one of the number of channels includes adjusting a phase of the channel clock signal corresponding to each of the at least one of the number of channels by a particular amount with respect to a reference clock signal.

4. The method of claim 3, wherein adjusting the phase of the channel clock signal corresponding to each of the at least one of the number of channels by the particular amount with respect to the controller clock signal includes adjusting the phase of the channel clock signal corresponding to each of the at least one of the number of channels by a different amount.

5. The method of claim 1, wherein adjusting the phase of the group of data signals corresponding to the at least one of the number of channels includes providing a number of skew groups, each skew group including at least two respective groups of data signals having the same associated skew amount.

6. The method of claim 1, wherein the respective data signals of each respective group of data signals are unskewed with respect to each other.

7. The method of claim 1, wherein adjusting the phase of the group of data signals corresponding to the at least one of the number of channels includes adjusting a phase of each respective group of data signals corresponding to each of the respective number of channels such that each of the respective groups of data signals are skewed with respect to each other.

8. The method of claim 7, including adjusting the phase of each respective group of data signals corresponding to each of the respective number of channels such that the adjusted phase of each respective group of data signals is a multiple of Tclk/N where Tclk is a period of a controller clock signal and N is the total number channels.

9. A method for channel skewing, comprising:
providing a number of data signals to a first memory device via a first channel having a first channel clock signal associated therewith; and
providing a number of data signals to a second memory device via a second channel having a second channel clock signal associated therewith;
wherein the number of data signals provided to the second memory device are skewed with respect to the number of data signals provided to the first memory device;
wherein the number of data signals provided to the second memory device are unskewed with respect to each other and the number of data signals provided to the first memory device are unskewed with respect to each other; and
wherein the number of data signals are provided to the first memory device in a source-synchronous manner and the number of data signals are provided to the second memory device in a source-synchronous manner such that the respective first and second channel clock signals are sourced along with the corresponding data signals.

10. The method of claim 9, wherein skewing the number of data signals provided to the second memory device includes adjusting a phase of the second channel clock signal with respect to a reference clock signal associated with a memory controller.

11. The method of claim 10, wherein at least one of the first channel clock signal and the second channel clock signal is in phase with the reference clock signal.

12. The method of claim 10, wherein skewing the number of data signals provided to the second memory device includes providing the reference clock signal to an adjustable delay component which provides the second channel clock signal at its output.

13. A method for channel skewing, comprising:
skewing data signals corresponding to particular channels of a memory system in accordance with a number of skew groups;
wherein each of the number of skew groups includes the data signals of each of at least one of a number of channels of the memory system, each of the number of channels including a dedicated channel clock signal associated with the data signals of the particular channel; and
wherein the data signals of all of the at least one of the number of channels of each respective skew group have a different skew amount than the data signals of every other skew group, and
maintaining the respective data signals of each of the at least one of the number of channels in an unskewed state with respect to each other; and
sourcing the respective dedicated channel clock signals along with the data signals of the corresponding skew groups such that the data signals are provided in a source-synchronous manner.

14. The method of claim 13, wherein the method includes skewing the dedicated channel clock signals in accordance with the number of skew groups.

15. The method of claim 13, wherein the number of skew groups is at least two, and wherein the method includes skewing the data signals in accordance with the number of skew groups such that the data signals of each of the respective channels of the memory system are skewed with respect to at least one adjacent channel.

16. The method of claim 13, wherein the number of skew groups is the same as the number of channels of the memory system.

17. The method of claim 13, wherein the method includes receiving, at a receiving component of the memory system, the respective data signals of each of the at least one of the number of channels in the unskewed state.

18. The method of claim 13, wherein skewing the data signals corresponding to the particular channels of the memory system in accordance with the number of skew groups includes providing an adjustable delay to each of the number of channels of the memory system.

19. A memory system, comprising:
a number of memory devices; and
a memory controller coupled to the number of memory devices via a plurality of channels each having a respective group of data signals and a respective channel clock signal associated therewith, wherein the respective data signals within each group are unskewed with respect to each other;
wherein the controller is configured to skew the group of data signals of at least one of the plurality of channels with respect to the group of data signals of at least one different channel; and
wherein the controller is configured to provide the respective groups of data signals along with their respective channel clock signals via the respective associated ones of the plurality of channels such that the respective groups of data signals are provided in a source-synchronous manner.

20. The memory system of claim 19, wherein the memory controller is configured to skew the groups of data signals of at least half of the plurality of channels.

21. The memory system of claim 20, wherein the memory controller is configured to skew the groups of data signals such that groups of data signals of every other channel are skewed by a same amount.

22. The memory system of claim 19, wherein the memory controller is configured to skew the groups of data signals such that groups of data signals of no adjacent channels have a same amount of skew.

23. The memory system of claim 19, wherein the memory controller is configured to skew the groups of data signals of the plurality of channels according to a number of particular skew groups, and wherein the respective groups of data signals within each of the respective number of particular skew groups have a same skew amount.

24. The memory system of claim 23, wherein the number of particular skew groups is at least four.

25. The memory system of claim 23, wherein the respective channel clock signal corresponding to the channels of each of the number of particular skew groups is adjusted such that a skew amount corresponding to each respective skew group is a multiple of Tclk/S where Tclk is a period of a reference clock signal of the controller and S is the number of particular skew groups.

26. The memory system of claim 19, wherein the controller is configured to skew the group of data signals of the at least one of the plurality of channels with respect to the group of data signals of the at least one different channel such that the group of data signals of the at least one of the plurality of channels are skewed by an amount equal to at least one quarter of a period of a reference clock signal.

27. The memory system of claim 19, wherein the controller is configured to skew the group of data signals of the at least one of the plurality of channels by providing a delay to the respective channel clock signal corresponding to the at least one of the plurality of channels, the delay based on a reference clock signal corresponding to the controller.

28. A memory system, comprising:
a number of memory devices;
a memory controller coupled to the number of memory devices via a plurality of channels each having a respective group of data signals and a respective channel clock signal associated therewith, wherein the respective data signals within each group are unskewed with respect to each other;
at least one delay component coupled to the controller and configured to:
receive a reference clock signal; and
provide a skew amount to at least one of the channel clock signals such that the at least one of the channel clock signals is out of phase with respect to the channel clock signal of at least one different channel; and
wherein each of the number of memory devices includes a receiver component configured to receive a respective one of the groups of data signals along with its respective associated channel clock signal.

29. The memory system of claim 28, wherein the at least one delay component is an adjustable delay component configured to provide an adjustable skew amount to the at least one of the channel clock signals.

30. The memory system of claim 28, wherein the at least one delay component is configured to provide the skew amount to the at least one of the channel clock signals such that the at least one of the channel clock signals is out of phase with respect to the channel clock signal of the at least one different channel by an amount equal to at least one quarter of a period of the reference clock signal.

31. The memory system of claim 28, wherein the system includes a phase detect component that receives a skew boundary signal from the at least one delay component.

32. The memory system of claim 31, wherein the phase detect component is configured to detect when the skew amount reaches an uppermost value.

* * * * *

UNITED STATES PATENT AND TRADEMARK OFFICE
CERTIFICATE OF CORRECTION

PATENT NO. : 8,472,279 B2
APPLICATION NO. : 12/872913
DATED : June 25, 2013
INVENTOR(S) : Travis E. Swanson et al.

It is certified that error appears in the above-identified patent and that said Letters Patent is hereby corrected as shown below:

In the Claims:

In column 10, line 46, in Claim 8, after "number" insert -- of --.

Signed and Sealed this
Seventeenth Day of September, 2013

Teresa Stanek Rea
*Deputy Director of the United States Patent and Trademark Office*